US009363617B2

(12) United States Patent
Ono et al.

(10) Patent No.: US 9,363,617 B2
(45) Date of Patent: Jun. 7, 2016

(54) SEMICONDUCTOR DEVICE HAVING A BASE, A CAVITY, A DIAPHRAGM, AND A SUBSTRATE

(75) Inventors: Kazuyuki Ono, Anjo (JP); Tomofumi Maekawa, Osaka (JP)

(73) Assignee: OMRON Corporation, Kyoto-shi, Kyoto (JP)

( * ) Notice: Subject to any disclaimer, the term of this patent is extended or adjusted under 35 U.S.C. 154(b) by 364 days.

(21) Appl. No.: 13/059,987

(22) PCT Filed: Feb. 20, 2009

(86) PCT No.: PCT/JP2009/000728
§ 371 (c)(1),
(2), (4) Date: May 11, 2011

(87) PCT Pub. No.: WO2010/029655
PCT Pub. Date: Mar. 18, 2010

(65) Prior Publication Data
US 2011/0204457 A1    Aug. 25, 2011

(30) Foreign Application Priority Data
Sep. 12, 2008   (JP) ................ 2008-235736

(51) Int. Cl.
*H01L 29/84*        (2006.01)
*H04R 31/00*        (2006.01)
(Continued)

(52) U.S. Cl.
CPC .............. *H04R 31/006* (2013.01); *B81C 3/001* (2013.01); *H01L 23/552* (2013.01); *B81B 2201/0257* (2013.01); *B81B 2203/0392* (2013.01); *H01L 24/27* (2013.01); *H01L 24/29* (2013.01);
(Continued)

(58) Field of Classification Search
CPC ............... H01L 2224/48091; H01L 2924/00; H01L 2924/00014; H04R 19/005; H04R 19/04; B81B 2201/0257
USPC .................................... 257/415, 416
See application file for complete search history.

(56) References Cited
U.S. PATENT DOCUMENTS 5,721,446 A * 2/1998 Kobayashi ............ G01L 19/147
                                              257/417
5,852,320 A * 12/1998 Ichihashi ............ G01L 19/0038
                                              257/417
(Continued)

FOREIGN PATENT DOCUMENTS

JP    2006-157863 A    6/2006
JP    2007-158044 A    6/2007

OTHER PUBLICATIONS

Wikipedia, Thermal Expansion.*
(Continued)

*Primary Examiner* — Jerome Jackson, Jr.
*Assistant Examiner* — David Chen
(74) *Attorney, Agent, or Firm* — Osha Liang LLP

(57) ABSTRACT

A semiconductor device has a semiconductor element having a base, a cavity having a polygonal horizontal cross-section penetrating vertically through the base, a diaphragm arranged on the base to cover the cavity, and a substrate formed with a die bonding pad. A lower surface of the semiconductor element is adhered on the die bonding pad with a die bonding resin. The die bonding pad is formed so as not to contact a lower end of a valley section formed by an intersection of wall surfaces of an inner peripheral surface of the cavity of the semiconductor element.

9 Claims, 12 Drawing Sheets

(51) Int. Cl.
*B81C 3/00* (2006.01)
*H01L 23/552* (2006.01)
*H04R 19/00* (2006.01)
*H04R 19/04* (2006.01)
*H01L 23/00* (2006.01)

(52) U.S. Cl.
CPC ............... *H01L24/32* (2013.01); *H01L 24/83* (2013.01); *H01L 2224/2731* (2013.01); *H01L 2224/2919* (2013.01); *H01L 2224/32225* (2013.01); *H01L 2224/73265* (2013.01); *H01L 2224/83192* (2013.01); *H01L 2224/83444* (2013.01); *H01L 2224/83447* (2013.01); *H01L 2224/83855* (2013.01); *H01L 2224/83862* (2013.01); *H01L 2924/00014* (2013.01); *H01L 2924/01079* (2013.01); *H01L 2924/10158* (2013.01); *H01L 2924/164* (2013.01); *H01L 2924/16152* (2013.01); *H04R 19/005* (2013.01); *H04R 19/04* (2013.01)

(56) References Cited

U.S. PATENT DOCUMENTS

| | | | |
|---|---|---|---|
| 6,201,285 B1* | 3/2001 | Iwata et al. | 257/419 |
| 6,255,728 B1* | 7/2001 | Nasiri et al. | 257/704 |
| 7,095,064 B2* | 8/2006 | Hamamoto | B81B 7/0029 257/254 |
| 7,166,910 B2 | 1/2007 | Minervini | |
| 2002/0181725 A1* | 12/2002 | Johannsen et al. | 381/174 |
| 2007/0205492 A1* | 9/2007 | Wang | 257/659 |
| 2007/0210392 A1* | 9/2007 | Sakakibara | B81B 7/007 257/414 |
| 2007/0284681 A1* | 12/2007 | Massieu et al. | 257/415 |
| 2008/0083961 A1* | 4/2008 | Suzuki et al. | 257/416 |
| 2008/0157238 A1 | 7/2008 | Hsiao | |
| 2008/0216296 A1* | 9/2008 | Prymak et al. | 29/25.03 |

OTHER PUBLICATIONS

International Search Report issued in PCT/JP2009/000728, mailed on Apr. 21, 2009, with translation, 2 pages.
Search Report issued in corresponding European Application No. 09812805.1, mailed Jul. 9, 2014 (7 pages).

* cited by examiner

Prior Art

SEMICONDUCTOR DEVICE HAVING A BASE, A CAVITY, A DIAPHRAGM, AND A SUBSTRATE

BACKGROUND OF THE INVENTION

1. Technical Field

The present invention relates to semiconductor devices. Specifically, the present invention relates to a semiconductor device in which a semiconductor element such as a sensor chip including a diaphragm is mounted on a substrate.

2. Background Art

FIG. 1 is a schematic cross-sectional view showing a structure of a conventional semiconductor device. A semiconductor device 11 has a lower surface of a semiconductor element 15 adhered to a die bonding pad 13 arranged on a substrate 12 like a printed wiring board using a die bonding resin 16 (silicone resin). The semiconductor element 15 has a diaphragm 14 laminated on the upper surface of a base 17, where the diaphragm 14 has the four corners fixed to the upper surface of the base 17, and a cavity 18 vertically passes through the base 17 so as not to inhibit the displacement or the vibration of the diaphragm 14. In the illustrated example, the upper half of the cavity 18 is a truncated pyramid shape, and the lower half is a reversed truncated pyramid shape, but the entire cavity 18 may be a truncated pyramid shape or a reversed truncated pyramid shape. The semiconductor device in which the semiconductor element is die bonded on the substrate like the printed wiring board includes a microphone disclosed in patent document 1, and the like.

In the assembly step of such semiconductor device 11, the die bonding resin 16 in the melted state is applied to the die bonding pad 13, the semiconductor element 15 is placed over the die bonding pad 13, and then the die bonding resin 16 is cured to fix the semiconductor element 15 to the substrate 12.

When die bonding the semiconductor element 15 to the substrate 12 in such manner, the die bonding resin 16 in the melted state is sometimes taken up to the upper surface of the base 17. If the die bonding resin 16 is taken up, the die bonding resin 16 enters the gap between the diaphragm 14 and the upper surface of the base 17 and cures thereat, whereby the die bonding resin 16 may fix the diaphragm 14 to the base 17 or may enter the gap between the diaphragm 14 and the base 17 and become a foreign substance. If the diaphragm 14 is fixed to the base 17, the diaphragm 14 cannot vibrate a defined amount and the semiconductor element 15 cannot obtain a predetermined sensitivity. If the die bonding resin 16 is sandwiched between the diaphragm 14 and the base 17 as a foreign substance, the vibration characteristics of the semiconductor element 15 change. The failure thus occurs in the semiconductor device 11 and the yield of the semiconductor device 11 lowers.

SUMMARY

The inventors of the present invention examined the phenomenon in which the die bonding resin 16 is taken up and found that it is caused by the following causes. FIGS. 2(a)-(c) and 3 are views for describing the causes. FIG. 2(a) is a schematic plan view of the semiconductor device 11. FIG. 2(b) is an enlarged cross-sectional view taken along line X-X of FIG. 2(a), and shows a cross-section of the semiconductor device 11 seen from a diagonal direction. FIG. 2(c) is an enlarged cross-sectional view taken along line Y-Y of FIG. 2(a), and shows a cross-section of the semiconductor device 11 seen from a diagonal direction. FIG. 3 shows a state in which the die bonding resin 16 rides up the wall surface of the cavity 18.

The die bonding resin 16 (silicone resin) has satisfactory wetting property with respect to the base 17 made of semiconductor material such as Si, and thus the force F1 of riding up the through the wall surface 19 of the cavity 18 acts on the die bonding resin 16. In particular, the force of riding up the die bonding resin 16 acts on a valley section 20 where the wall surface 19 and the wall surface 19 cross from each wall surface 19 on both sides of the valley section 20, and a force of pushing up the die bonding resin 16 also acts by the capillary action as a narrow gap forms at the valley section 20. As a result, a large force F2 of riding up the die bonding resin 16 acts at the valley section 20 compared to the wall surface 19, and the die bonding resin 16 rides up to a higher position at the valley section 20. The height (distance) the die bonding resin 16 rides up the wall surface is determined by (1) surface tension that acts on the die bonding resin, (2) easiness in wetting of the wall surface, and (3) density of the die bonding resin.

Due to such causes, the die bonding resin 16 in the melted state rides up along the valley section 20, as shown with a broken line arrow in FIG. 2B, enters the gap between the diaphragm 14 and the base 17 from the valley section 20 as shown in FIG. 2C, and further spreads along the gap between the diaphragm 14 and the base 17. As a result, the diaphragm 14 fixes to the base 17 by the die bonding resin 16, or the die bonding resin 16 becomes a foreign substance thereby narrowing the gap between the diaphragm 14 and the base 17.

The height or the amount the die bonding resin 16 rides up the valley section 20 changes depending on the elapsed time after the application and the application amount of the die bonding resin 16, and thus, consideration is made to reduce the application amount of the die bonding resin 16, or to reduce the time from when the die bonding resin 16 is applied until cured to avoid the above. However, in the method of reducing the application amount of the die bonding resin 16, the thickness of the die bonding resin 16 sandwiched between the die bonding pad 13 and the semiconductor element 15 becomes thin, and thus the action of alleviating the external impact on the semiconductor element 15 with the die bonding resin 16 may not be sufficiently obtained or the mounting strength of the semiconductor element 15 may lower. In the method of reducing the time until curing the die bonding resin 16, the manufacturing cost is high since a great number of semiconductor devices 11 cannot be processed all together, and the semiconductor device 11 needs to be transferred to a heating furnace to cure the die bonding resin 16 by a small number at a time. These methods are thus not practical.

One or more embodiments of the present invention provides a semiconductor device capable of preventing the die bonding resin from riding up the cavity through the valley section of the cavity arranged in the semiconductor element.

A semiconductor device according to one or more embodiments of the present invention includes a semiconductor element in which a cavity having a polygonal horizontal cross-section penetrates vertically through a base and a diaphragm is arranged on the base to cover the cavity, and a substrate formed with a die bonding pad, a lower surface of the semiconductor element being adhered on the die bonding pad with a die bonding resin; wherein the die bonding pad is formed so as not to contact a lower end of a valley section formed when a wall surface and a wall surface intersect at an inner peripheral surface of the cavity of the semiconductor element.

In a semiconductor device according to one or more embodiments of the present invention, the die bonding pad is formed so as not to contact the lower end of the valley section, and thus the die bonding resin does not touch the lower end of the valley section even if spread over the upper surface of the die bonding pad when the die bonding resin in the melted state is applied on the die bonding pad and the lower surface of the semiconductor element is overlapped thereon. Therefore, drawback in that the die bonding resin enters from the lower end of the valley section and rises up the cavity along the valley section thus fixing the diaphragm of entering the gap under the diaphragm and becoming a foreign substance can be prevented.

In a semiconductor device according to one or more embodiments the present invention, the substrate is a printed substrate, the die bonding pad is formed to include a conductor pattern of the printed substrate; and the conductor pattern is removed in a region (hereinafter referred to as valley section facing region) facing the lower end of the valley section. If the substrate is a printed substrate, an opening can be formed in the conductor pattern by removing the conductor pattern in the valley section facing region, so that the die bonding resin can be prevented from rising up along the valley section.

In a semiconductor device according to one or more embodiments of the present invention, at least one part of a surface of an outer peripheral portion of the conductor pattern removed region of the conductor pattern is formed by an inorganic material such as Cu and Au. The inorganic material particularly Cu and Au does not have satisfactory wetting property with the die bonding resin, and thus the die bonding resin flowed towards the valley section facing region can be stopped at the portion formed with the inorganic material by forming at least one part of the surface of the outer peripheral portion of the conductor pattern removed region with an inorganic material such as Cu and Au, and the die bonding resin can be prevented from flowing into the conductor pattern removing region and contacting the lower end of the valley section.

In a semiconductor device according to one or more embodiments of the present invention, an outer peripheral edge of the die bonding pad is positioned on an outer side than an outer peripheral edge of the lower surface of the semiconductor element. Accordingly the die bonding resin between the die bonding pad and the lower surface of the semiconductor element easily flows to the outer side of the semiconductor element since the die bonding pad is spread to the outer side than the semiconductor element. The die bonding resin that flows to the inner side of the semiconductor element reduces by such amount, and the die bonding resin is less likely to contact the wall surface of the cavity.

In a semiconductor device according to one or more embodiments of the present invention, the lower surface of the semiconductor element has an entire surface excluding a region in the vicinity of the lower end of the valley section adhered to the die bonding pad. Accordingly, the adhering area of the semiconductor element can be increased since the lower surface of the semiconductor element is adhered with the entire surface excluding the region in the vicinity of the lower end of the valley section, and hence the adhering strength of the semiconductor element can be enhanced and the buffering effect by the die bonding resin can be enhanced.

DETAILED DESCRIPTION

Embodiments of the present invention will be hereinafter described with reference to the accompanied drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

First Embodiment

Figure 1:
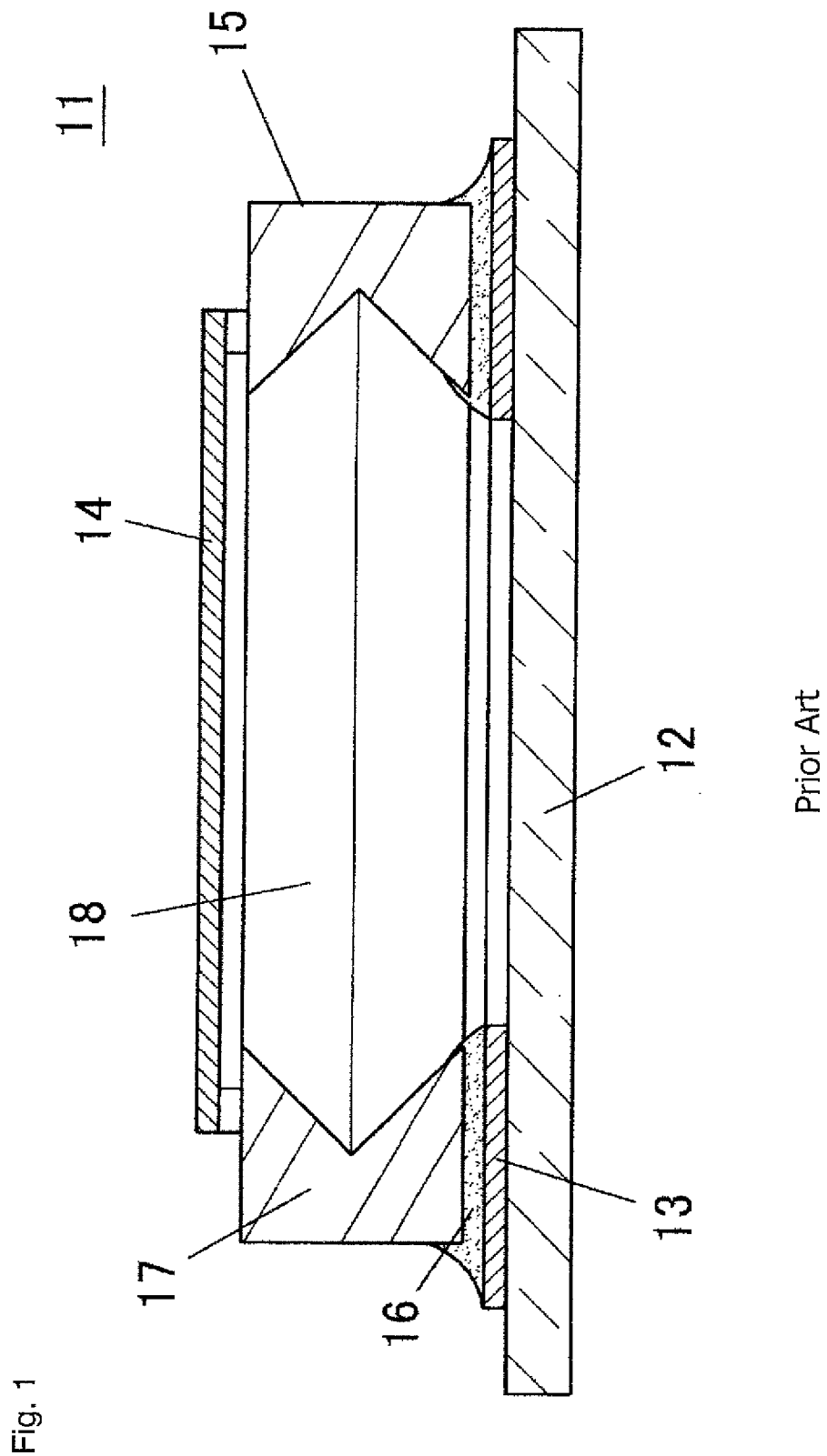
FIG. 1 is a schematic cross-sectional view of a conventional semiconductor device.
Figure 2:
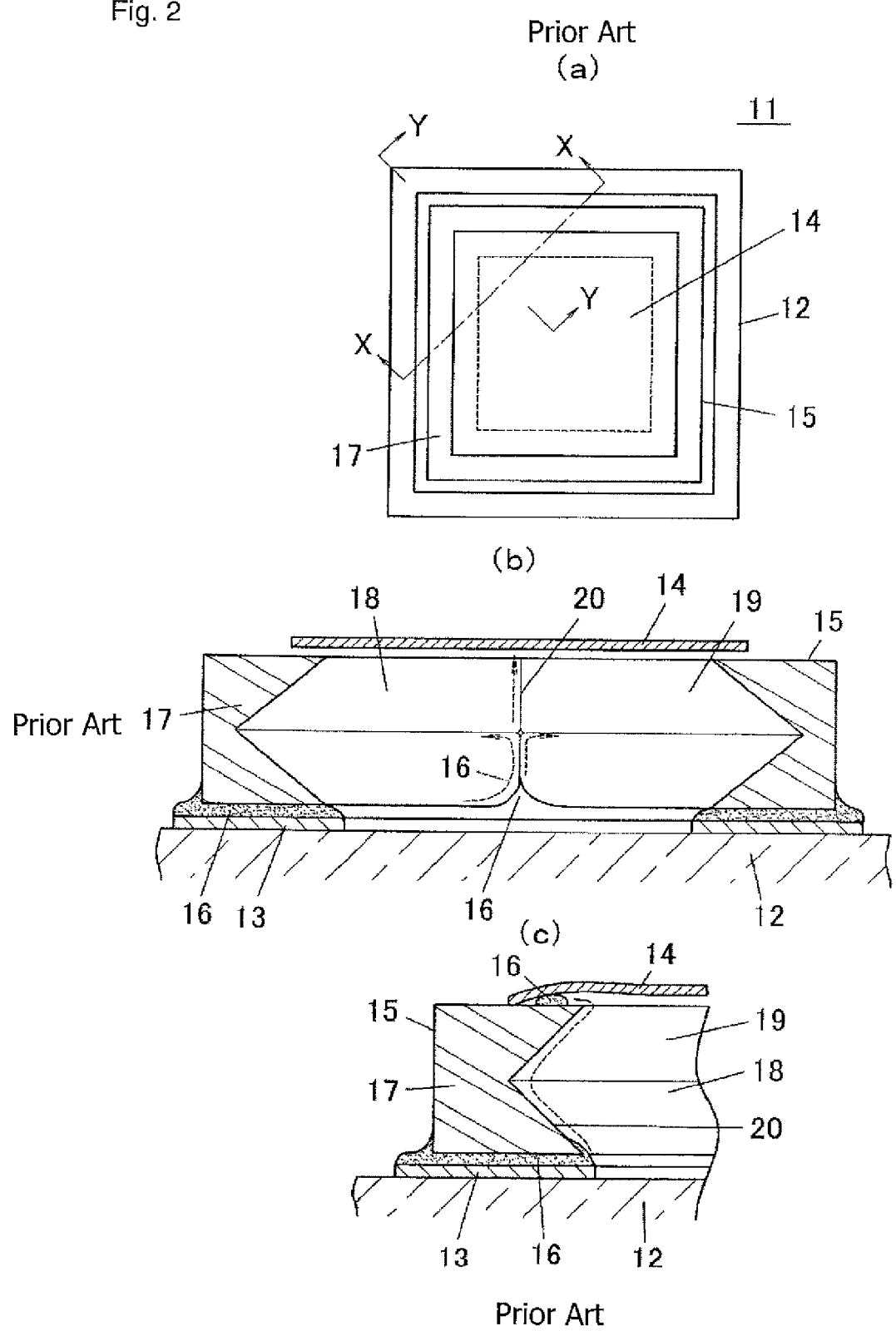
FIG. 2(a) is a schematic plan view of the semiconductor device.
FIG. 2(b) is an enlarged cross-sectional view taken along line X-X of FIG. 2(a)
FIG. 2(c) is an enlarged cross-sectional view taken along line Y-Y of FIG. 2(a).
Figure 3:
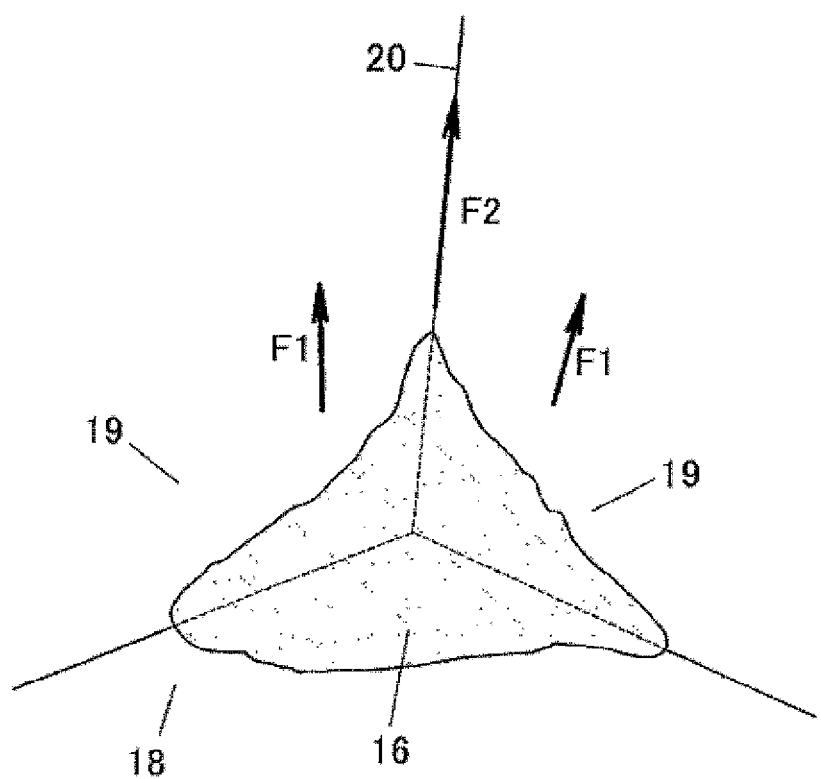
FIG. 3 is a view describing the reasons the die bonding resin runs up along a valley line.
Figure 4:
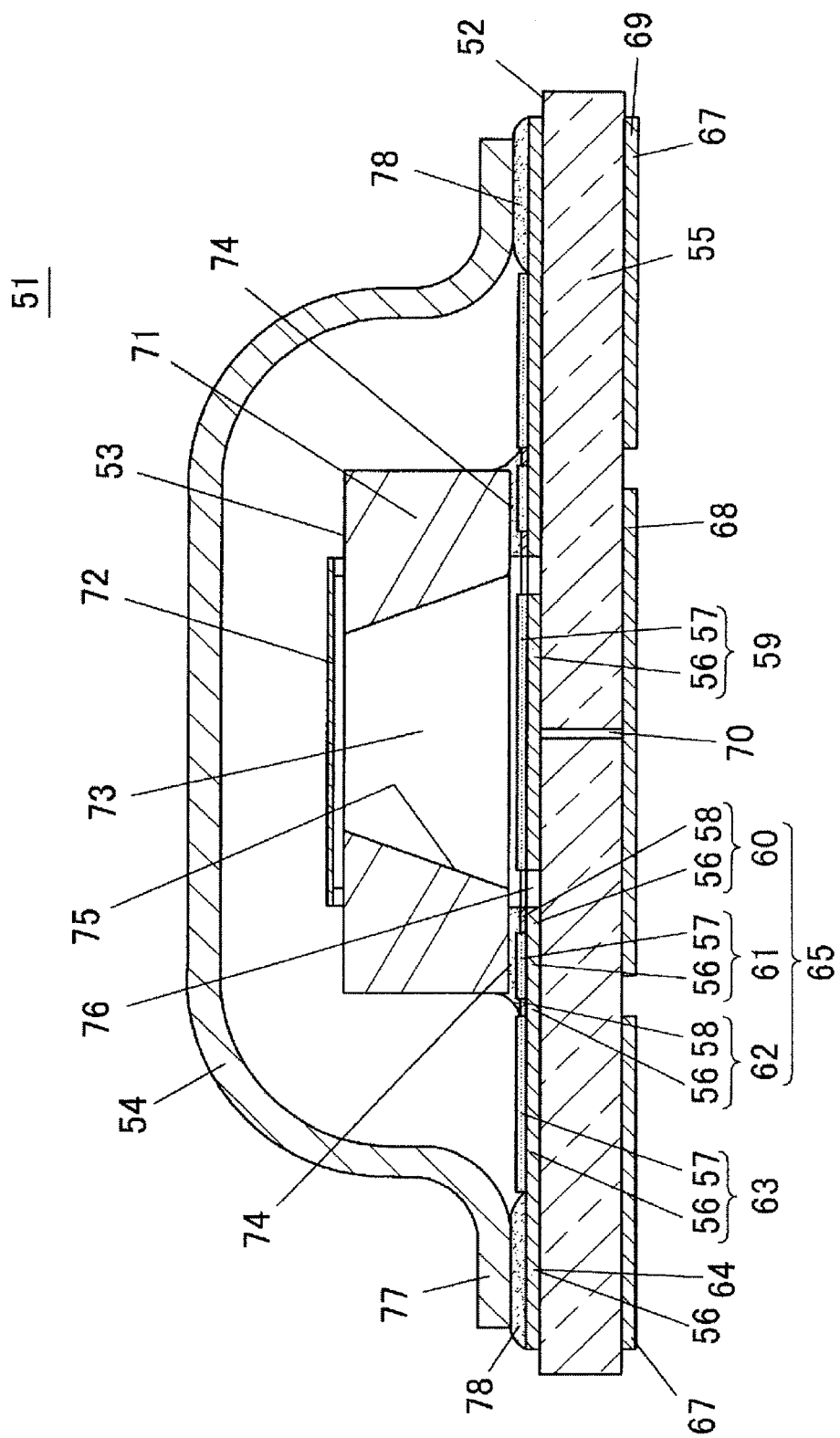
FIG. 4 is a cross-sectional view of a semiconductor device according to a first embodiment of the present invention.
Figure 5:
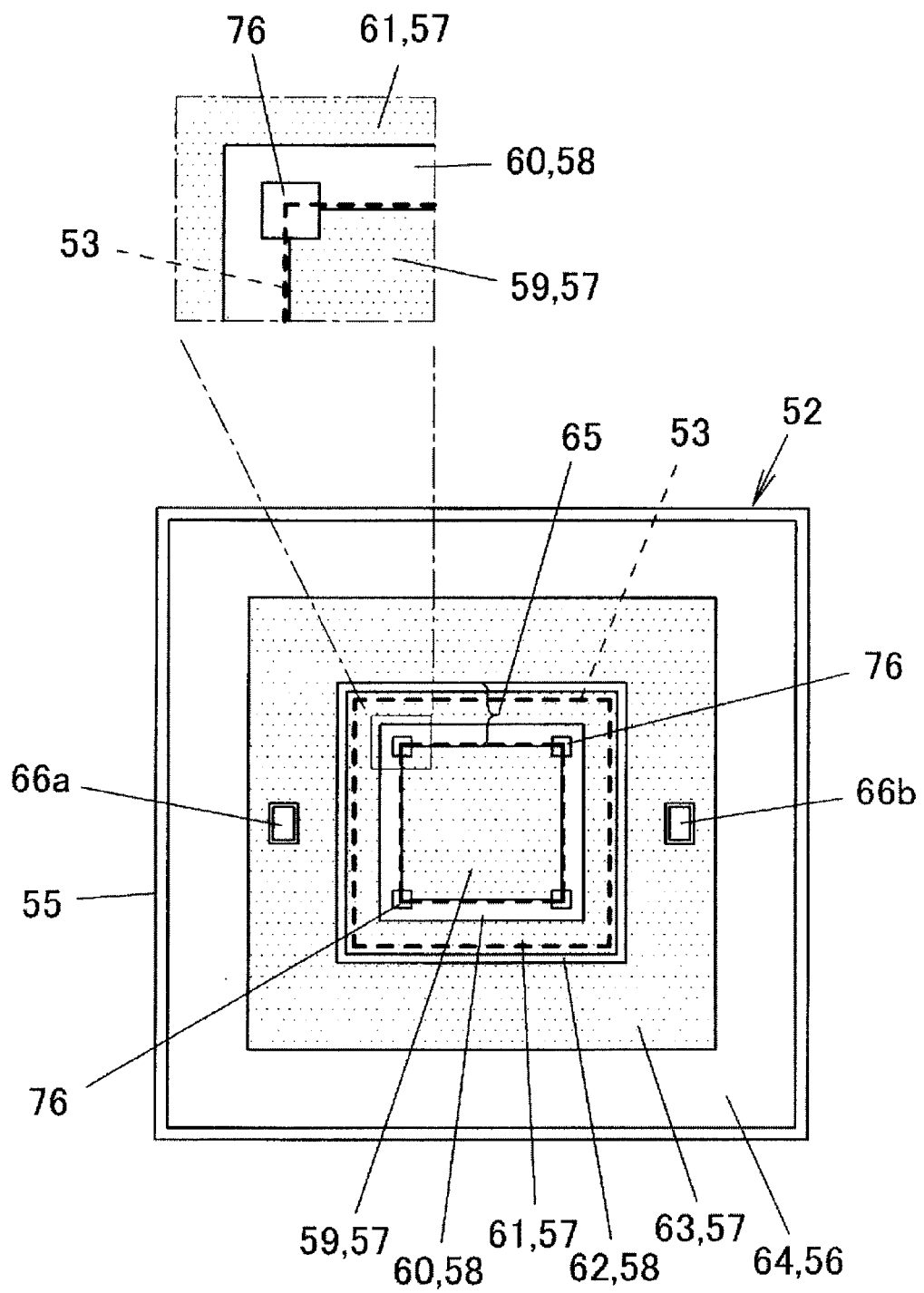
FIG. 5 is a plan view of a printed wiring board used in the semiconductor device of the first embodiment.

FIG. 4 is a cross-sectional view showing a structure of a semiconductor device 51 according to a first embodiment of the present invention, and shows the cross-section in the diagonal direction of a substrate 52. FIG. 5 is a plan view of the substrate 52 used in the semiconductor device 51, and also shows one part thereof in an enlarged manner. The semiconductor device 51 shown here has a semiconductor element 53 mounted on an upper surface of the substrate 52, and the semiconductor element 53 accommodated in a package (Faraday cage) including the substrate 52 and a conductive cap 54.

The substrate 52 is configured by a printed board, where a conductor pattern 56 (metal foil) of copper foil, and the like is stacked on substantially the entire surface of the upper surface of a substrate core material 55 (prepreg), as shown in FIG. 4. A conductor pattern 69 (metal foil) of Cu and the like is also stacked on substantially the entire surface of the lower surface of the substrate core material 55, where an extraction electrode 67 and a rear surface side ground pattern 68 are formed by patterning the conductor pattern 69. The conductor pattern 56 on the upper surface is electrically connected to the rear surface side ground pattern 68 through the lower through a through-hole 70. The extraction electrode 67 and the rear surface side ground pattern 68 are patterns for solder mounting to the substrate (e.g., mother board for portable telephone) for mounting the semiconductor device 51.

As shown in FIG. 5, a first solder resist region 59 of a square shape in which the surface of the conductor pattern 56 is covered with a solder resist 57 is formed at a central part of the substrate 52. An inner peripheral side plated region 60 applied with an inorganic material layer 58 in which an inorganic material such as Cu and Au is plated on the surface of the conductor pattern 56 is formed to an annular shape on the outer side of the first solder resist region 59. A second solder resist region 61 of an annular shape in which the surface of the conductor pattern 56 is covered with the solder resist 57 is formed on the outer side of the inner peripheral side plated region 60. An outer peripheral side plated region 62 in which the inorganic material layer 58 including an inorganic material such as Cu and Au is applied on the surface of the conductor pattern 56 is formed to an annular shape on the outer side of the second solder resist region 61. Furthermore, a third solder resist region 63 of an annular shape in which the surface of the conductor pattern 56 is covered with the solder resist 57 is formed on the outer side of the outer peripheral side plated region 62. The region on the outer side of the third solder resist region 63 is a ground electrode portion 64 where the conductor pattern 56 is exposed.

The solder resist 57 for protecting the conductor pattern 56 is obtained by applying the solder resist in the melted state to the surface of the surface of the substrate 52 by screen printing at an even thickness, and then heating to be cured. In this embodiment, the solder resist is used as the covering member, but a silk pattern, and the like may be used. Since the copper foil is generally used for the conductor pattern 56 of the substrate 52, Au is desirably used for the inorganic material layer 58 of the inner peripheral side plated region 60 and the outer peripheral side plated region 62.

The electrode pads 66a, 66b are arranged by exposing the conductor pattern 56 at one part of the third solder resist region 63. The electrode pads 66a, 66b are separated from the conductor pattern 56 of the third solder resist region 63 and electrically separated, and are electrically connected to the extraction electrode 67 of the rear surface of the substrate 52 through the through-hole (not shown).

The semiconductor element 53 includes various types of sensing sensor chip (e.g., acoustic sensor, pressure sensor, etc.) including a diaphragm, and is an acoustic sensor (or transducer for converting acoustic vibration to electric energy) for detecting the acoustic vibration in the first embodiment. The semiconductor element 53 has a diaphragm 72 for sensing the acoustic vibration attached to the upper surface of the base 71 formed by processing the Si substrate, and the like, and detects the displacement of the diaphragm 72 due to acoustic vibration by electrostatic method and the like. A cavity 73 having a square frustum shape is formed on the base 71 on the lower side of the diaphragm 72, and the cavity 73 penetrates the base 71 vertically. The cavity 73 is not limited to a square frustum shape as long as it penetrates vertically with a horizontal cross-section of a multiangular shape, and may be a polygonal frustum shape such as a triangular frustum shape or a pentagular frustum shape. Alternatively, the upper part of the cavity 73 may be a polygonal frustum shape and the lower part may be a reversed polygonal frustum shape. The diaphragm 72 has four corners fixed to the upper surface of the base 71, where a gap (vent hole) is formed between the lower surface of the diaphragm 72 and the upper surface of the base 71 at four sides on the outer periphery excluding the four corners.

The lower surface of the semiconductor element 53 is a square ring shape surrounding the cavity 73, and is adhered and fixed on the die bonding pad 65 of the substrate 52 by the die bonding resin 74. An adhesive resin such as silicone resin having flexibility is used for the die bonding resin 74, where the die bonding resin 74 applied to a transfer pin (stamper) is transferred onto the die bonding pad 65, then the semiconductor element 53 is placed thereon and pushed with an even force, and the die bonding resin 74 is heated and cured to fix the semiconductor element 53. The die bonding resin 74 also acts to shield and buffer the extra force from the external environment other than to fix the semiconductor element 53. The terminal of the semiconductor element 53 and the electrode pads 66a, 66b are wire connected by a bonding wire (not shown), and hence the terminal of the semiconductor element 53 is electrically conducted to the extraction electrode 67 at the lower surface.

As shown in FIGS. 4 and 5, the die bonding pad 65 is formed by the inner peripheral side plated region 60, the second solder resist region 61, and the outer peripheral side plated region 62. In FIG. 5, the positions of the inner peripheral end and the outer peripheral end of the lower surface of the semiconductor element 53 mounted on the upper surface of the substrate 52 are respectively indicated with a broken line. The inner peripheral end of the lower surface of the semiconductor element 53 substantially coincides with the inner peripheral end of the die bonding pad 65 (inner peripheral end of inner peripheral side plated region 60), and the outer peripheral end of the die bonding pad 65 (outer peripheral end of outer peripheral side plated region 62) is positioned on the outer side than the outer peripheral end of the lower surface of the semiconductor element 53.

At the position corresponding to the lower end of the valley section 75 formed at the four corners of the cavity 73, the opening 76 is formed excluding the die bonding pad 65 (conduct pattern 56) by etching, and the substrate core material 55 is exposed at the opening 65. The opening 76 has a square shape in FIG. 5, but the shape of the opening 76 is not limited to a square and may be a circle or a polygonal etc. other than a square. The size of the opening 76 merely needs to have a length of one side of about 0.20 mm. The mounting accuracy of when mounting the semiconductor element 53 on the substrate 52 is ±0.05 mm, and thus a gap of at least 0.05 mm can be ensured between the lower end of the valley section 75 and the edge of the opening 76 if the dimension of the opening 76 has one side of 0.20 mm.

The conductive cap 54 is formed to a cap shape by a metal material having small specific resistance, and a space for accommodating the semiconductor element 53 and the like is formed at the lower surface. A flange 77 extending substantially horizontally is formed over the entire periphery at the lower end of the conductive cap 54.

The conductive cap 54 is mounted on the substrate 52 so as to cover the semiconductor element 53, and the like, where the lower surface of the flange 77 is joined and fixed to the ground electrode portion 64 by a conductive joining member 78 and electrically connected to the ground electrode portion 64 by the conductivity of the conductive joining member 78. The conductive cap 54 thus becomes the same potential (ground potential) as the rear surface side ground pattern 68 of the lower surface. A material such as conductive epoxy resin (e.g., epoxy resin containing silver filler), solder, and the like is used for the conductive joining member 78.

If the semiconductor element 53 to be mounted is an acoustic sensor, a hole (not shown) for passing the acoustic vibration may be formed at the vertex of the conductive cap 54. The package including the conductive cap 54 and the substrate 52 may have a sealed structure depending on the type of semiconductor element 53 to accommodate. For instance, if dust, light, and the like from the outside are to be shielded, the semiconductor element 53 and the like may be covered with the package, where the package desirably has air tightness if humidity resistance and chemical resistance are required although air tightness is not necessarily required.

As shown in FIG. 5, according to the semiconductor device 51 configured as above, the surface of the conductor pattern 56 is covered with the solder resist 57 in the second solder resist region 61 between the inner peripheral side plated region 60 and the outer peripheral side plated region 62 at the die bonding pad 65. The die bonding resin 74 such as silicone resin has higher adhering strength with respect to the solder resist than with respect to the inorganic material such as Cu and Au, and thus the adhering strength of the semiconductor element 53 by the die bonding resin 74 becomes higher by forming the solder resist 57 at one part of the die bonding pad 65.

In the semiconductor device 51, the inner peripheral side plated region 60 and the outer peripheral side plated region 62 covered with the inorganic material layer 58 having unsatisfactory wetting property with respect to the die bonding resin are formed at the inner peripheral part and the outer peripheral part of the die bonding pad 65, and hence the die bonding resin 74 can be prevented from leaking out to the inner peripheral side and the outer peripheral side of the die bonding pad 65. The reason therefor is as follows.

A flexible resin such as silicone resin is used for the die bonding resin 74 to alleviate the factors of characteristic fluctuation such as external impact, which resin has a property of being easy to flow. The resin such as silicone resin has satisfactory wetting property and small contact angle with respect to the solder resist, which is the same organic material. Furthermore, the solder resist formed on the conductor pattern 56 is less likely to have the end face formed to a right angle and tends to be rounded. Thus, when the entire surface of the die bonding resin 65 is covered with the solder resist 57, the contact angle θ of when the die bonding resin 74 is applied becomes small, and consequently, the applied die bonding resin 74 easily flows out from the end of the die bonding pad 65, and the flow-out amount increases with time once the die bonding resin 74 starts to flow out.

The resin such as silicone resin has unsatisfactory wetting property and large contact angle with respect to the inorganic material. Furthermore, the inorganic material tends to have the end face easily formed to a right angle compared to the solder resist. Therefore, if the surface of the inner peripheral part and the outer peripheral part of the die bonding pad 65 is configured by the inorganic material, the contact angle θ of when the die bonding resin 74 is applied becomes large and the die bonding resin 74 becomes a spherical shape at the edge of the die bonding pad 65, and hence the applied die bonding resin 74 is less likely to flow out to the outer peripheral side or the inner peripheral side from the end of the die bonding pad 65.

If the die bonding resin 74 is inhibited from flowing out from the die bonding pad 65, the phenomenon in which the die bonding resin 74 that flowed out covers one part of the ground electrode portion 64 thereby inhibiting the joining of the conductive cap 54 to the ground electrode portion 64, and lowering the shielding property of the high frequency noise can be prevented.

If the die bonding resin 74 flows out from the die bonding pad 65, the thickness of die bonding resin 74 between the semiconductor element 53 and the die bonding pad 65 becomes thin with increase in the flow-out amount, but the variation in the thickness of the die bonding resin 74 can be reduced by managing the application amount of the die bonding resin 74 since the flow-out of the die bonding resin 74 can be prevented according to the first embodiment. As a result, the joining strength of the semiconductor element 53 becomes even, the capacity of the cavity 73 becomes even, the elasticity of the die bonding resin 74 becomes even, and the quality of the semiconductor device 51 stabilizes.

Furthermore, since the flow-out of the die bonding resin 74 can be prevented, the thickness of the die bonding resin 74 at the lower surface of the semiconductor element 53 can be increased, and the effect of shielding redundant external force with the die bonding resin 74 can be further enhanced.

In the semiconductor device 51 of the first embodiment, the opening 76 is provided by removing the die bonding pad 65 (conductor pattern 56) in the region (region facing valley section) facing the lower end of the valley section 75, and thus the possibility the die bonding resin 74 applied to the die bonding pad 65 touches the lower end of the valley section 75 is small. Thus, the die bonding resin 74 can be prevented from entering the valley section 75 from the lower end of the valley section 75, rising up the valley section 75 and reaching the upper surface of the base 71.

Since the inorganic material layer 58 made of inorganic material such as Au having unsatisfactory wetting property with the die bonding resin 74 and which end face easily becomes a right angle is formed at the periphery of the opening 76, the die bonding resin 74 that attempts to flow towards the opening 76 is stopped by the inorganic material layer 58. The base 71 is formed from Si and has satisfactory wetting property with the die bonding resin 74 such as silicone resin, and thus the die bonding resin 74 accumulated at the distal end of the inner peripheral side plated region 60 rides up to the upper side along the outer peripheral side surface of the base 71 and forms a large resin fillet. As a result, the die bonding resin 74 that flowed towards the inner peripheral side of the die bonding pad 65 is inhibited from running out or flowing into the opening 76. The die bonding resin 74 that ran out or flowed out into the opening 76 is thus prevented from touching the lower end of the valley section 75 and running up the valley section 75. The entire periphery of the opening 76 is desirably surrounded with the inorganic material layer 58, but the inorganic material layer 58 may be formed at the periphery of the opening 76 only in the direction the die bonding resin 74 flows, as shown in FIG. 5, in the present embodiment.

Furthermore, the outer peripheral end of the die bonding pad 65 is positioned on the outer side than the outer peripheral end at the lower surface of the semiconductor element 53, and the outer peripheral end at the lower surface of the semiconductor element 53 is on the second solder resist region 61, and thus die bonding resin 74 is pulled towards the outer peripheral side than the inner peripheral side and thus easily runs out to the outer peripheral side. Thus, the amount of die bonding resin 74 flowing to the inner peripheral side where the opening 76 is formed can be reduced, whereby the die bonding resin 74 is less likely to run out or flow out into the opening 76 and the die bonding resin 74 can be prevented from touching the lower end of the valley section 75 and running up the valley section 75.

The die bonding resin 74 in the melted state thus does not touch the lower end of the valley section 75 and run up the valley section 75, so that the diaphragm 72 is prevented from getting fixed to the base 71 by the die bonding resin 74 or being sandwiched between the diaphragm 72 and the base 71 as a foreign substance thereby inhibiting vibration and displacement.

In the semiconductor device 51, the Faraday cage is configured by a substrate 52 including the rear surface side ground pattern 68 and the conductor pattern 56 ground connected with the conductive cap 54 connected to the ground, and hence the semiconductor element 53 can be blocked from external high frequency noise and the influence of the semiconductor element 53 by external noise can be reduced.

Furthermore, the warp of the substrate 52 due to temperature change, and the like can be prevented since substantially the entire surface of both front and rear surfaces of the substrate 52 are covered with a conductor pattern.

Second Embodiment

Figure 6:
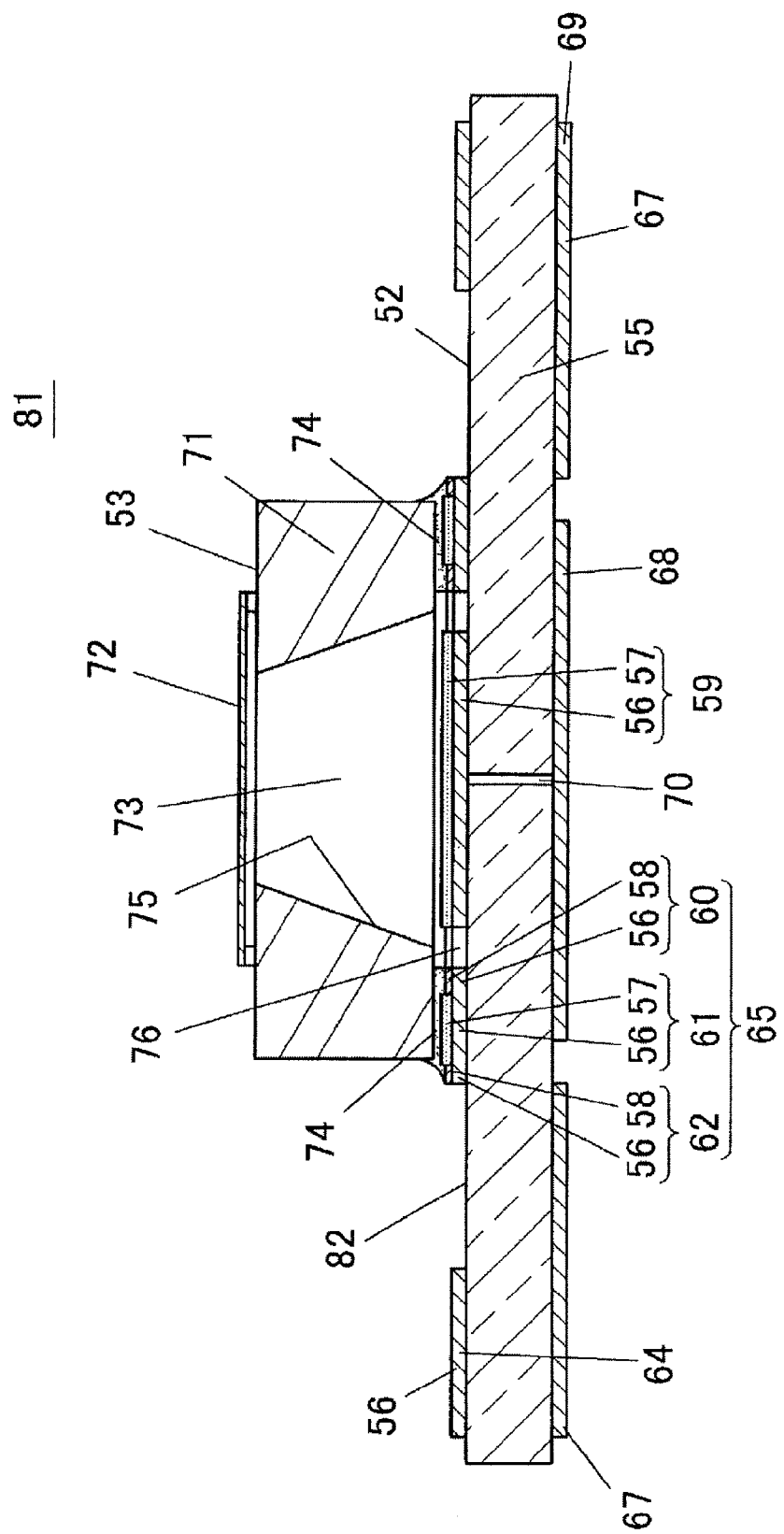
FIG. 6 is a cross-sectional view in which one part of the semiconductor device according to a second embodiment of the present invention is omitted.
Figure 7:
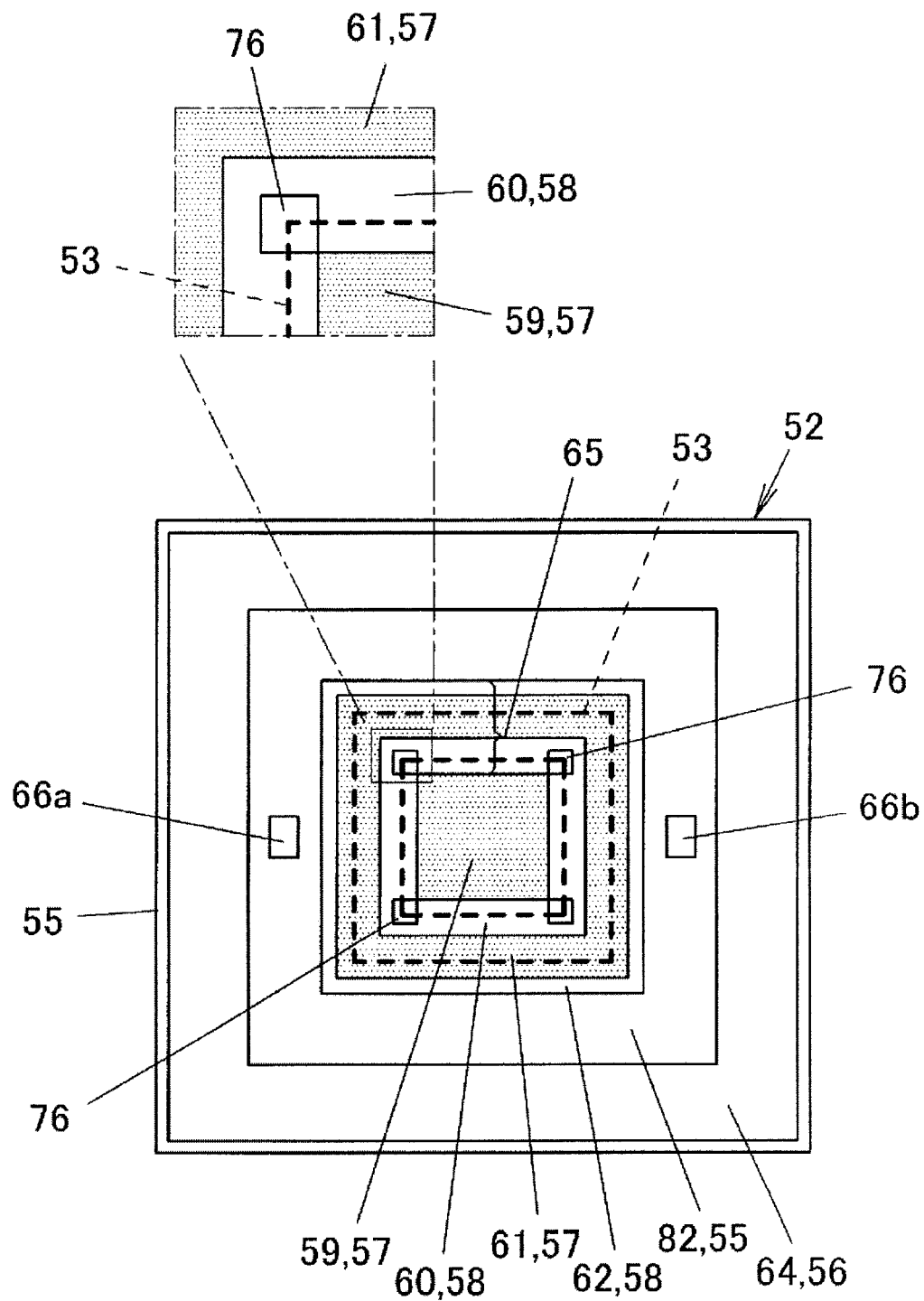
FIG. 7 is a plan view of the printed wiring board used in the semiconductor device of the second embodiment.

FIG. 6 is a cross-sectional view showing a structure of a semiconductor device 81 according to a second embodiment of the present invention, and shows a state before attaching the conductive cap 54. FIG. 7 is a plan view of the substrate 52 used in the semiconductor device 81, and also shows one part thereof in an enlarged manner. In the second embodiment, the third solder resist region 63 in the first embodiment is removed to arrange a groove portion 82, and the substrate core material 55 is exposed in the groove portion 82. If such groove portion 82 is formed, the effect of stopping the die bonding resin 74 at the outer peripheral end of the die bonding pad 65 (or outer peripheral side plated region 62) becomes higher, and the die bonding resin 74 is less likely to flow towards the outer side of the die bonding pad 65 and attach to the ground electrode portion 64.

As shown in FIG. 7, in the second embodiment, the inner peripheral end of the inner peripheral side plated region 60 is positioned on the inner side than the inner peripheral end (edge of cavity 73) at the lower surface of the semiconductor element 53, so that the entire periphery of the opening 76 is surrounded with the inner peripheral side plated region 60. The surface of the inner peripheral side plated region 60 is formed by the inorganic material layer 58 which has unsatisfactory wetting property with respect to the die bonding resin 74 and which end face tends to become a right angle, and hence the die bonding resin 74 is stopped at the entire periphery of the opening 76 and is more unlikely to flow into the opening 76, and the possibility of the die bonding resin 75 touching the lower end of the valley section 75 becomes smaller.

Variant of Second Embodiment

Figure 8:
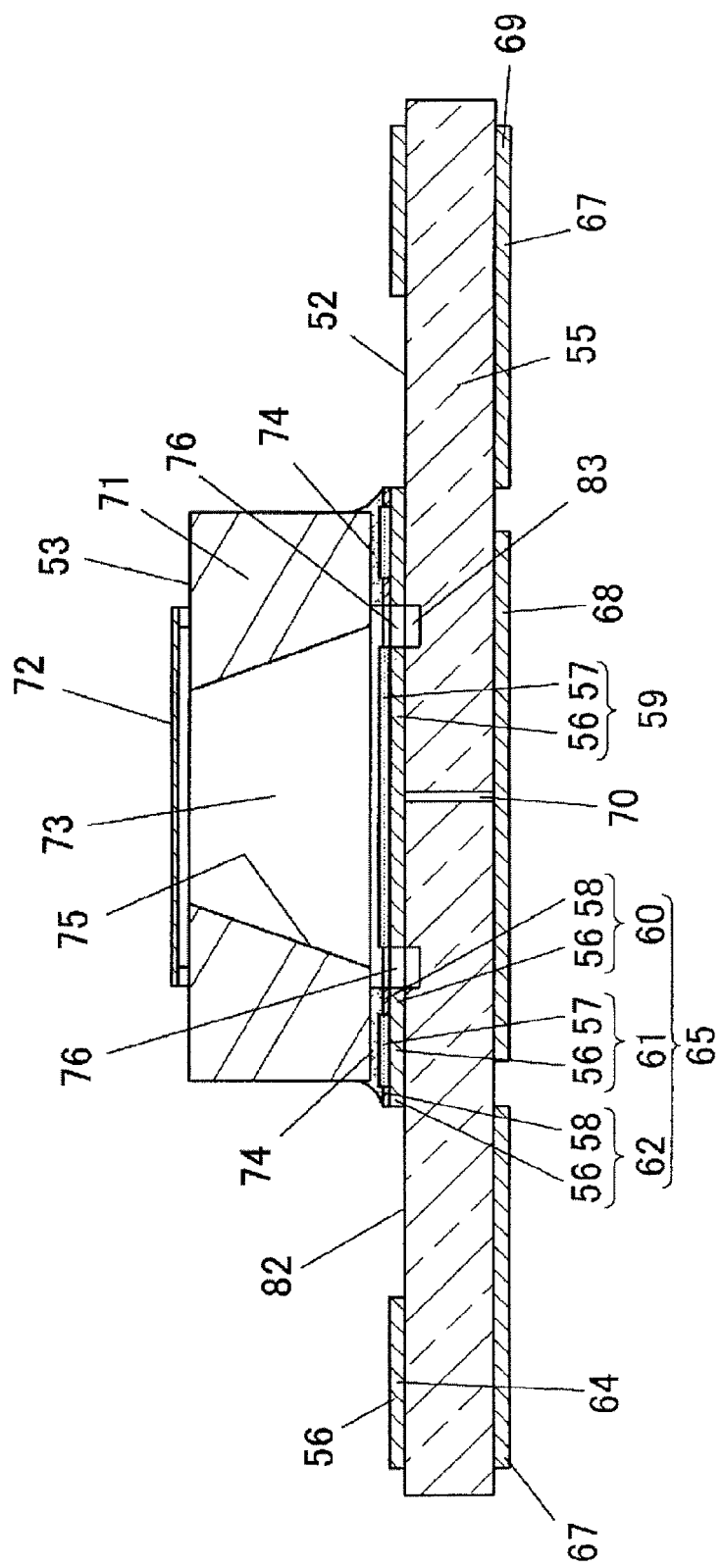
FIG. 8 is a cross-sectional view in which one part of a semiconductor device according to a variant of the second embodiment is omitted.

FIG. 8 is a cross-sectional view showing a structure of a variant of the second embodiment, and shows a state before attaching the conductive cap 54. In the variant, the substrate core material 55 is omitted at the bottom surface of the opening 76 to arrange an excavated portion 83. Since the excavated portion 83 is formed in the opening 76, the depth of the opening 76 becomes deeper and the die bonding resin 74 is less likely to touch the lower end of the valley section 75 in the unlikely event the die bonding resin 74 flows into the opening 76, whereby the possibility the die bonding resin 74 runs up along the valley section 75 becomes smaller.

The deepening of the opening 76 can be applied to embodiments other than the second embodiment.

Third Embodiment

Figure 9:
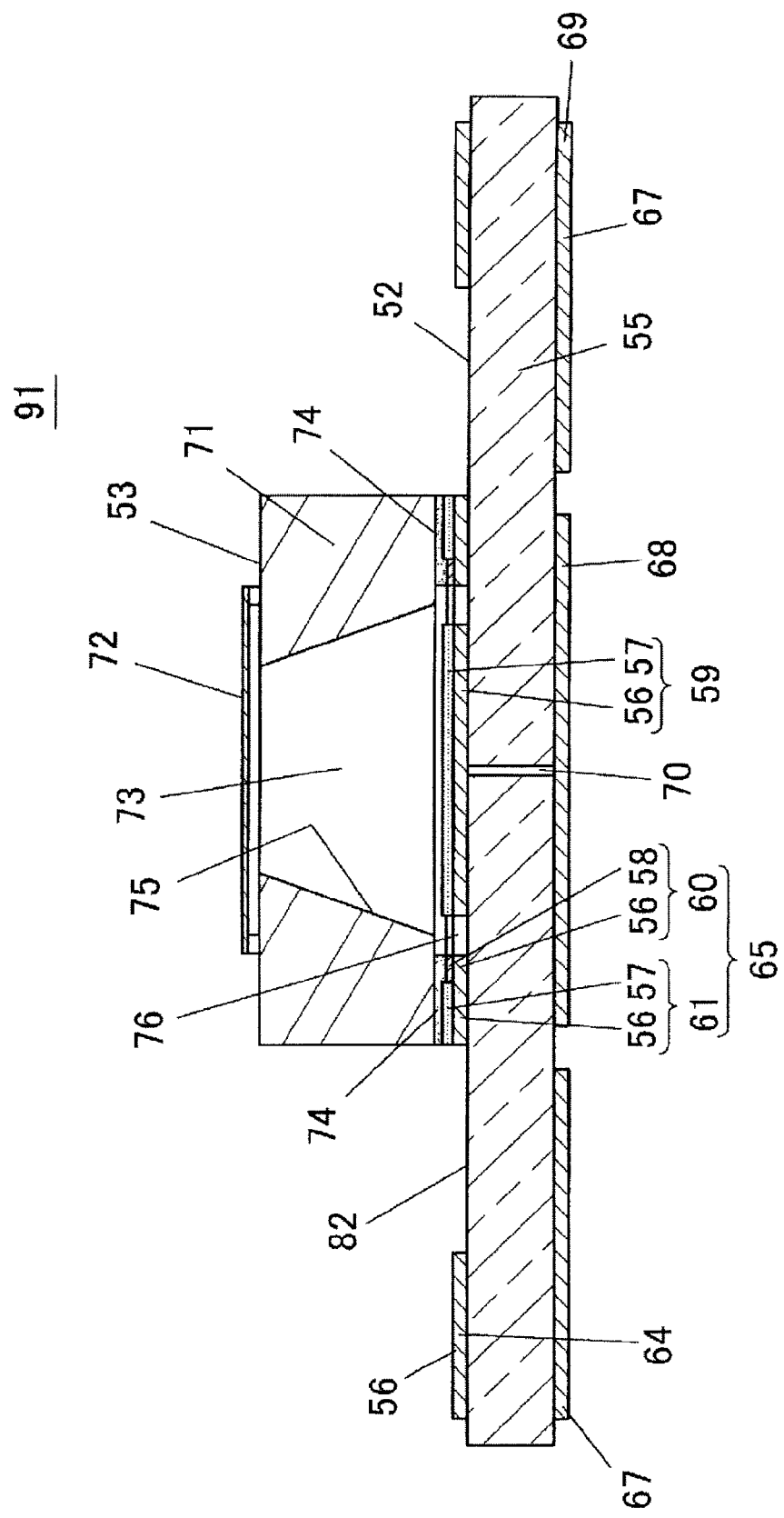
FIG. 9 is a cross-sectional view in which one part of a semiconductor device according to a third embodiment of the present invention is omitted.
Figure 10:
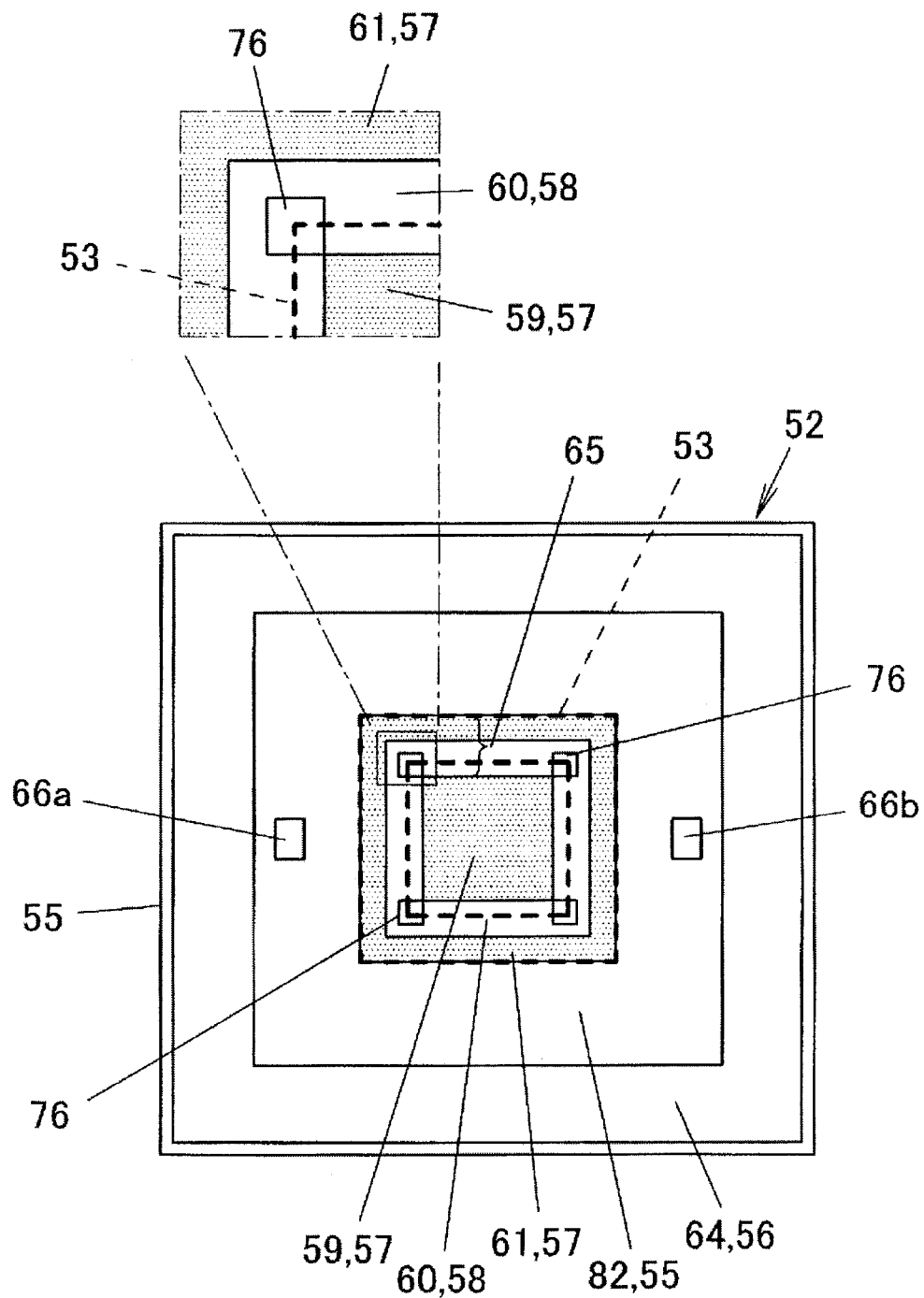
FIG. 10 is a plan view of a printed wiring board used in the semiconductor device of the third embodiment.

FIG. 9 is a cross-sectional view showing a structure of a semiconductor device 91 according to a third embodiment of the present invention, and shows a state before attaching the conductive cap 54. FIG. 10 is a plan view of the substrate 52 used in the semiconductor device 91, and also shows one part thereof in an enlarged manner. In the third embodiment, the outer peripheral side plated region 62 in the second embodiment is removed to enlarge the groove portion 82, and the outer peripheral end of the second solder resist region 61 is substantially coincided with the outer peripheral end of the lower surface of the semiconductor element 53. According to such embodiment, the die bonding resin 74 that flowed out to the outer side is less likely to flow to the ground electrode portion 64 since the groove portion 82 can be widened.

Fourth Embodiment

Figure 11:
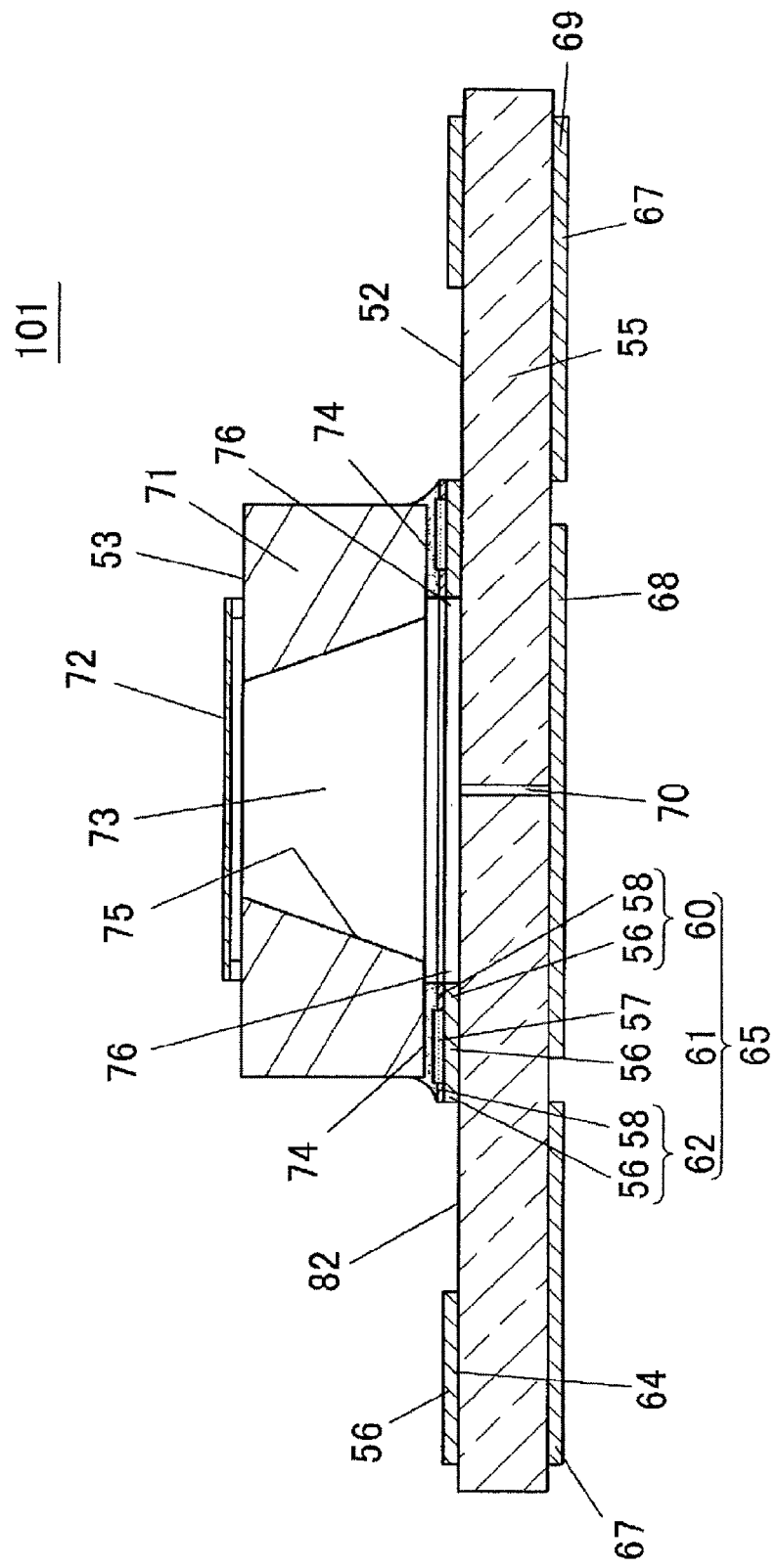
FIG. 11 is a cross-sectional view in which one part of a semiconductor device according to a fourth embodiment of the present invention is omitted.
Figure 12:
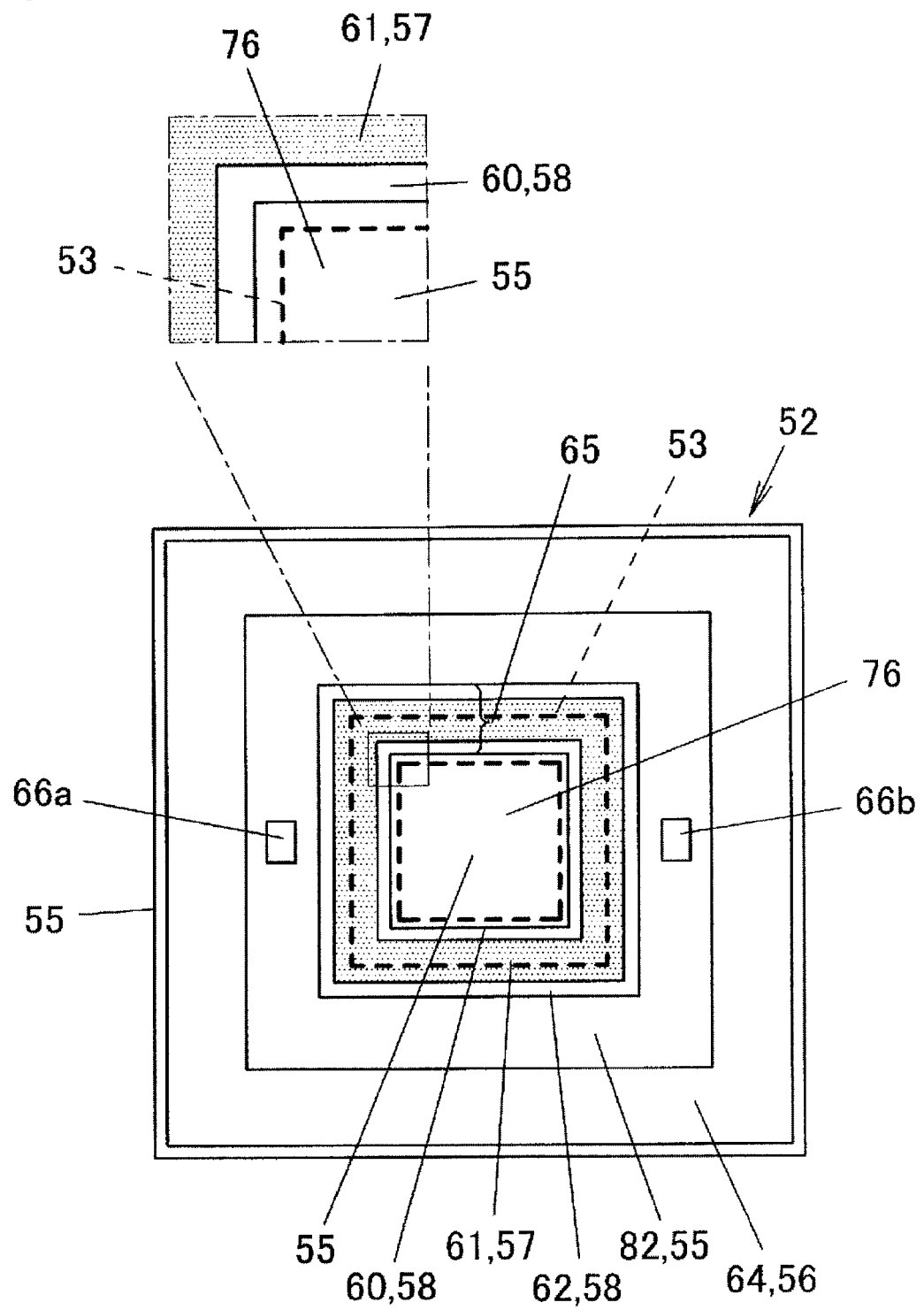
FIG. 12 is a plan view of a printed wiring board used in the semiconductor device of the fourth embodiment.

FIG. 11 is a cross-sectional view showing a structure of a semiconductor device 101 according to a fourth embodiment of the present invention, and shows a state before attaching the conductive cap 54. FIG. 12 is a plan view of the substrate 52 used in the semiconductor device 101, and also shows one part thereof in an enlarged manner. In the fourth embodiment, the first solder resist region 59 in the second embodiment is removed to expose the substrate core material 55. The inner peripheral end of the inner peripheral side plated region 60 is positioned on the outer peripheral side than the inner peripheral end (edge of cavity 73) of the lower surface of the semiconductor element 53 to form the opening 76 entirely on the inner side than the inner peripheral side plated region 60 including the region facing the valley section. In the fourth embodiment, the entire inner side of the die bonding pad 65 is the opening 76, and the effect of stopping the die bonding resin 74 with the inner peripheral end of the die bonding pad 65 (or inner peripheral side plated region 60) is enhanced by removing the first solder resist region 59, and thus the effect of preventing the die bonding resin 74 from running up the valley section 75 becomes higher.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF SYMBOLS

51, 81, 91, 101 semiconductor device
52 substrate
53 semiconductor element
55 substrate core material
56 conductor pattern
57 solder resist
58 inorganic material layer
59 first solder resist region
60 inner peripheral side plated region
61 second solder resist region
62 outer peripheral side plated region
63 third solder resist region
64 ground electrode portion
65 die bonding pad
71 base
72 diaphragm
73 cavity
74 die bonding resin
75 valley section
76 opening

The invention claimed is:
1. A semiconductor device comprising:
  a semiconductor element comprising:
    a base;
    a cavity having a polygonal horizontal cross-section penetrating vertically through the base;
    a diaphragm arranged on the base to cover the cavity; and
    a substrate formed with a die bonding pad,
  wherein the cavity comprises an inner peripheral surface having two wall surfaces,
  wherein a lower surface of the semiconductor element is adhered on the die bonding pad with a silicone die bonding resin, wherein the silicone die bonding resin is formed so as not to contact a lower end of a valley section formed by an intersection of the two wall surfaces of the inner peripheral surface of the cavity of the semiconductor element, and wherein the cavity completely overlaps a solder resist region comprising a solder resist protected portion of a conductor pattern.

2. The semiconductor device according to claim 1, wherein the substrate is a printed substrate, the die bonding pad being formed to include the conductor pattern; and
a portion of the conductor pattern is removed in a region facing the lower end of the valley section.

3. The semiconductor device according to claim 2, wherein at least one part of a surface of an outer peripheral portion of the conductor pattern removed region of the conductor pattern is formed by an inorganic material.

4. The semiconductor device according to claim 1, wherein an outer peripheral edge of the die bonding pad is positioned on an outer side than an outer peripheral edge of the lower surface of the semiconductor element.

5. The semiconductor device according to claim 1, wherein the lower surface of the semiconductor element has an entire surface excluding a region in the vicinity of the lower end of the valley section adhered to the die bonding pad.

6. The semiconductor device according to claim 2, wherein at least one part of a surface of an outer peripheral portion of the conductor pattern removed region of the conductor pattern is formed by copper (Cu).

7. The semiconductor device according to claim 2, wherein at least one part of a surface of an outer peripheral portion of the conductor pattern removed region of the conductor pattern is formed by gold (Au).

8. The semiconductor device according to claim 3, wherein the inorganic material is copper (Cu) or gold (Au).

9. A semiconductor device comprising:
a semiconductor element comprising:
a base;
a cavity having a polygonal horizontal cross-section penetrating vertically through the base;
a diaphragm arranged on the base to cover the cavity; and
a substrate formed with a die bonding pad,
wherein the cavity comprises an inner peripheral surface having two wall surfaces,
wherein a lower surface of the semiconductor element is adhered on the die bonding pad with a silicone die bonding resin,
wherein the silicone die bonding resin is formed so as not to contact a lower end of a valley section formed by an intersection of the two wall surfaces of the inner peripheral surface of the cavity of the semiconductor element,
wherein the substrate is a printed substrate, the die bonding pad being formed to include a conductor pattern of the printed substrate,
wherein a portion of the conductor pattern is removed in a region facing the lower end of the valley section,
wherein a non-removed portion of the conductor pattern of the printed substrate is disposed in a horizontal plane including the region facing the lower end of the valley section where the conductor pattern is removed,
wherein the non-removed portion of the conductor pattern faces the diaphragm, and
wherein the cavity completely overlaps a solder resist region comprising the non-removed portion of the conductor pattern, wherein the non-removed portion of the conductor pattern is a solder resist protected conductor pattern.

* * * * *